US011239378B2

(12) United States Patent
Zhang

(10) Patent No.: US 11,239,378 B2
(45) Date of Patent: Feb. 1, 2022

(54) SOLAR CELL WITH REDUCED SURFACE RECOMBINATION

(71) Applicant: International Business Machines Corporation, Armonk, NY (US)

(72) Inventor: Chen Zhang, Albany, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/690,918

(22) Filed: Nov. 21, 2019

(65) Prior Publication Data
US 2020/0091353 A1     Mar. 19, 2020

Related U.S. Application Data

(62) Division of application No. 15/974,979, filed on May 9, 2018, now abandoned.

(51) Int. Cl.
*H01L 31/0216*    (2014.01)
*H01L 31/068*     (2012.01)
(Continued)

(52) U.S. Cl.
CPC ............ *H01L 31/02168* (2013.01); *H01L 31/022441* (2013.01); *H01L 31/068* (2013.01);
(Continued)

(58) Field of Classification Search
CPC ....... H01L 31/02168; H01L 31/022441; H01L 31/068; H01L 31/022425; H01L 31/02167;
(Continued)

(56) References Cited

U.S. PATENT DOCUMENTS 4,395,583 A    7/1983   Meulenberg, Jr.
8,603,900 B2  12/2013   Ramappa
             (Continued)

FOREIGN PATENT DOCUMENTS

CN    102315314 A  *  1/2012
CN    102315314 A     1/2012
             (Continued)

OTHER PUBLICATIONS

List of IBM Patents or Patent Applications Treated as Related; (Appendix P), Filed Nov. 21, 2019; 2 pages.

*Primary Examiner* — Michael Y Sun
(74) *Attorney, Agent, or Firm* — Cantor Colburn LLP; Robert Sullivan

(57) ABSTRACT

A solar cell is provided. The solar cell includes a p-n junction and a coating. The p-n junction includes upper and lower layers. The coating overlies the upper layer of the p-n junction. The coating includes a transparent conductive layer and a gate dielectric layer, which is interposed between the transparent conductive layer and the upper layer of the p-n junction. The solar cell further includes a front-contact and a back-contact, which are electrically communicative with each other. The front-contact is electrically communicative with the upper layer of the p-n junction through the coating. The back-contact is electrically communicative with the lower layer of the p-n junction. The solar cell can also include a contact via electrically communicative with the back-contact and with the transparent conductive layer.

16 Claims, 5 Drawing Sheets

(51) Int. Cl.
    *H01L 31/02*     (2006.01)
    *H01L 31/0224*     (2006.01)
    *H01L 29/40*     (2006.01)
    *H01L 29/49*     (2006.01)
    *H01L 29/06*     (2006.01)
    *H01L 29/737*     (2006.01)

(52) U.S. Cl.
    CPC ...... *H01L 29/0638* (2013.01); *H01L 29/0649* (2013.01); *H01L 29/408* (2013.01); *H01L 29/4983* (2013.01); *H01L 29/7373* (2013.01); *H01L 31/02021* (2013.01); *H01L 31/0224* (2013.01); *H01L 31/02167* (2013.01); *H01L 31/022425* (2013.01); *H01L 31/022475* (2013.01); *H01L 31/022483* (2013.01)

(58) Field of Classification Search
    CPC ........... H01L 31/02021; H01L 29/0638; H01L 29/0649; H01L 29/408; H01L 29/4983; H01L 29/7373; H01L 31/0224; H01L 31/022475; H01L 31/022483; Y02E 10/547
    See application file for complete search history.

(56) References Cited

U.S. PATENT DOCUMENTS

| | | | |
|---|---|---|---|
| 2009/0014069 A1* | 1/2009 | Chan | ............... H01L 31/1804 136/259 |
| 2009/0020158 A1 | 1/2009 | Ohtsuka | |
| 2009/0078300 A1 | 3/2009 | Ang et al. | |
| 2009/0260685 A1 | 10/2009 | Lee | |
| 2010/0218816 A1* | 9/2010 | Guha | ............... H01L 31/0682 136/256 |
| 2011/0139230 A1 | 6/2011 | Rohatgi | |
| 2011/0168243 A1 | 7/2011 | Elowe et al. | |
| 2012/0322199 A1 | 12/2012 | Graff | |
| 2013/0263920 A1 | 10/2013 | Fidaner | |
| 2013/0312813 A1* | 11/2013 | Chuang | ............... H01L 31/068 136/251 |
| 2014/0060627 A1 | 3/2014 | Haensch et al. | |
| 2014/0283906 A1* | 9/2014 | Atwater | ............ H01L 31/02021 136/256 |
| 2017/0133538 A1 | 5/2017 | Gloger et al. | |
| 2019/0348548 A1 | 11/2019 | Zhang | |

FOREIGN PATENT DOCUMENTS

| | | |
|---|---|---|
| CN | 102332485 A | 1/2012 |
| CN | 104485391 A | 4/2015 |
| CN | 102792453 B | 6/2015 |
| CN | 103700728 B | 1/2017 |
| TW | 201526274 A | 7/2015 |

* cited by examiner

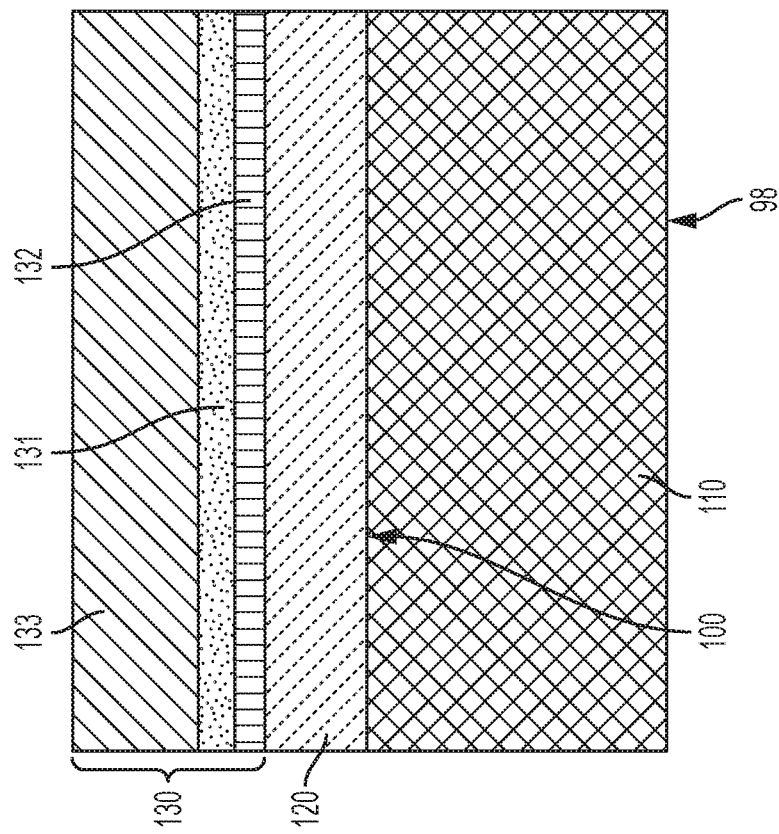
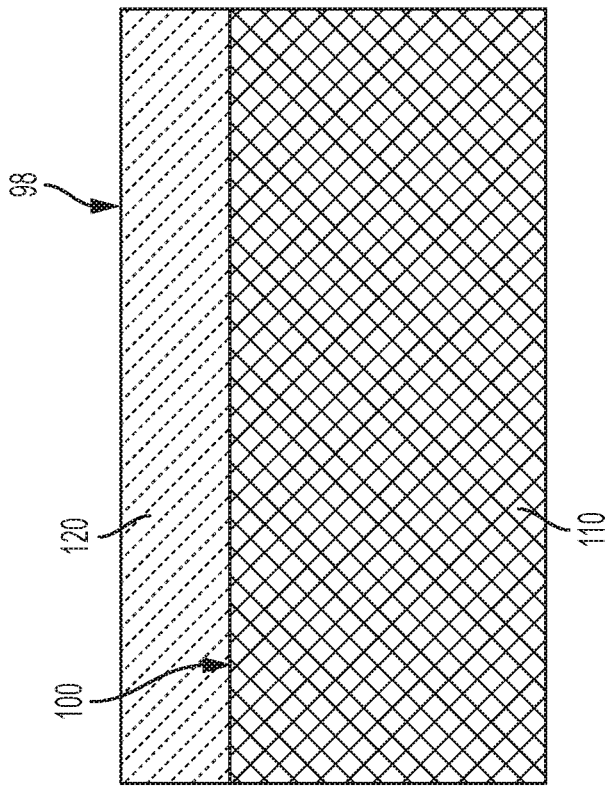

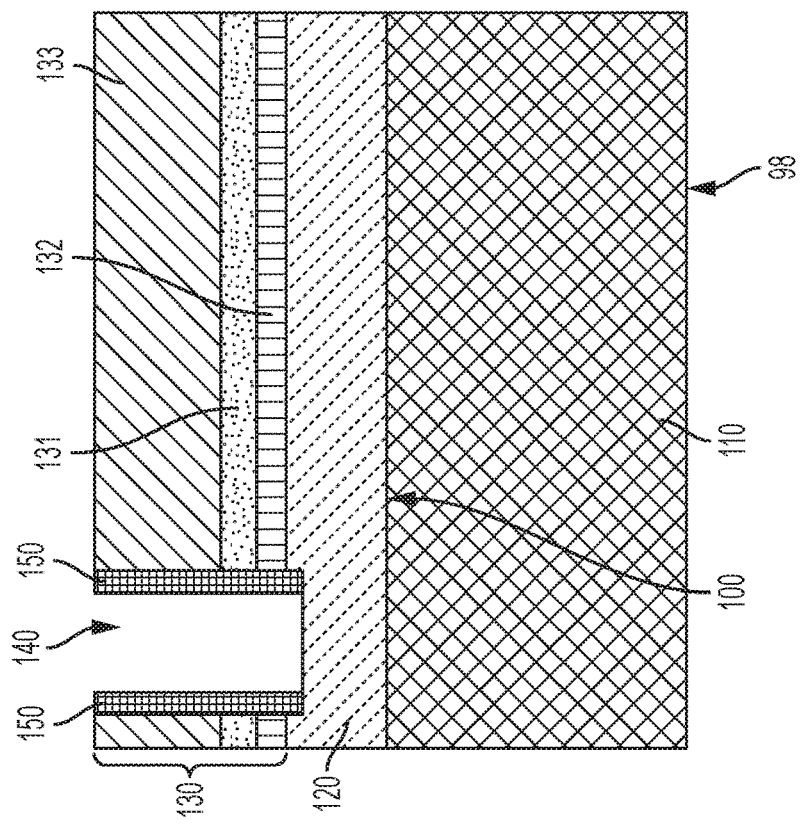
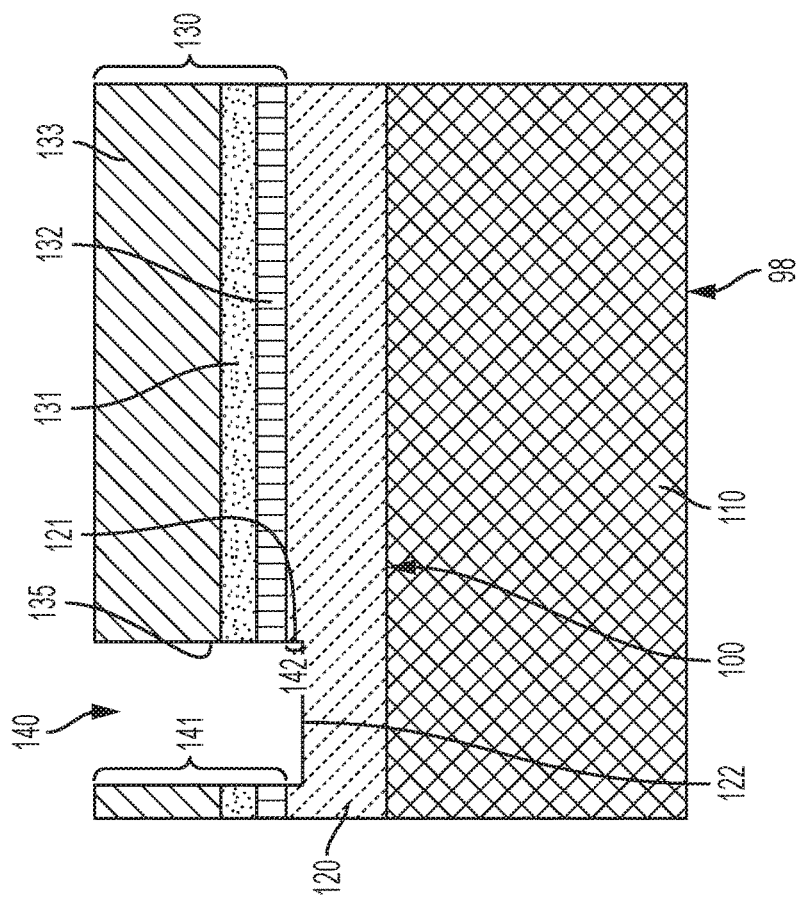

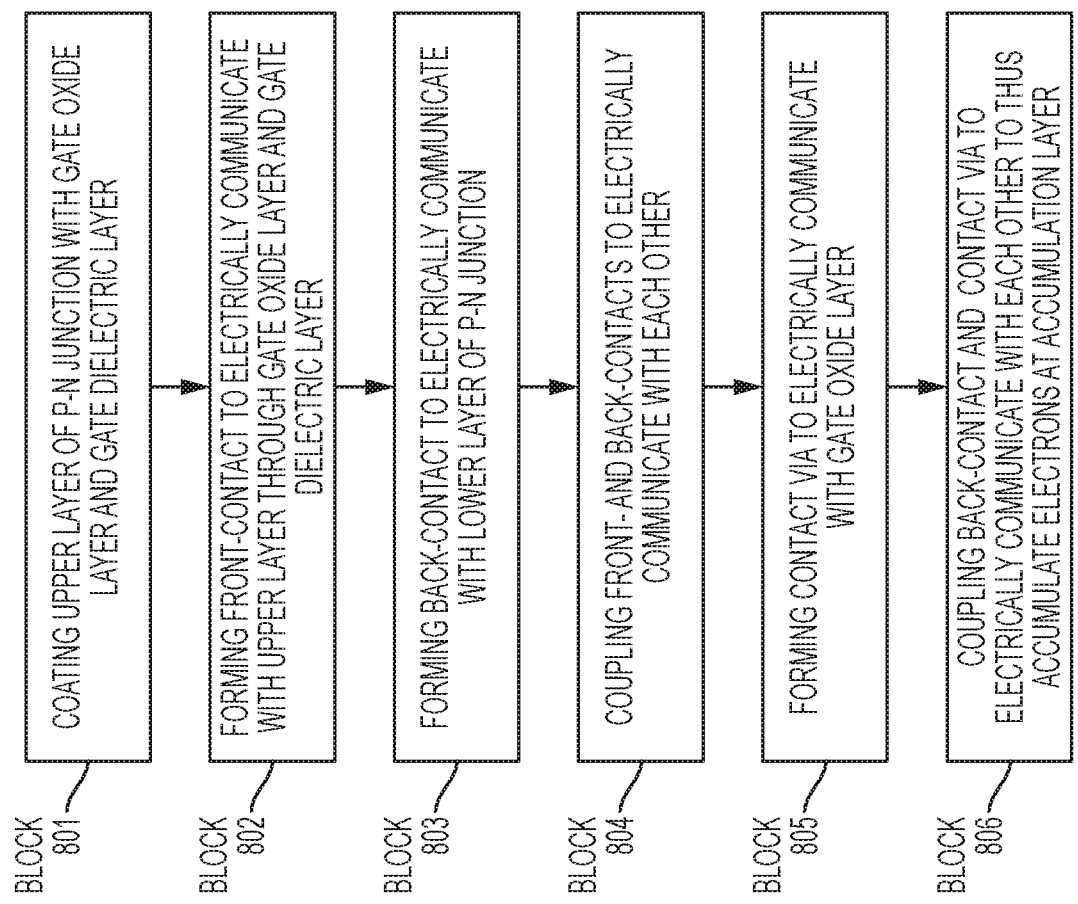

SOLAR CELL WITH REDUCED SURFACE RECOMBINATION

DOMESTIC PRIORITY

This application is a divisional application of U.S. application Ser. No. 15/974,979, titled "SOLAR CELL WITH REDUCED SURFACE RECOMBINATION", which was filed on May 9, 2018. The entire disclosures of U.S. application Ser. No. 15/974,979 are incorporated herein by reference.

BACKGROUND

The present invention generally relates to solar cells. More specifically, the present invention relates to a solar cell with reduced surface recombination.

A solar or photovoltaic cell is an electrical device that converts the energy of light directly into electricity by the photovoltaic effect, which is a physical and chemical phenomenon. Individual solar cells can be combined to form modules, otherwise known as solar panels. Operations of solar cells generally involve three attributes: the absorption of light to generate electron-hole pairs or excitons; the separation of charge carriers of opposite types; and the separate extraction of those carriers to an external circuit.

SUMMARY

Embodiments of the present invention are directed to a solar cell. A non-limiting example of the solar cell includes a p-n junction and a coating. The p-n junction includes upper and lower layers. The coating overlies the upper layer of the p-n junction. The coating includes a transparent conductive layer and a gate dielectric layer, which is interposed between the transparent conductive layer and the upper layer of the p-n junction. The non-limiting example of the solar cell further includes front and back contacts, which are electrically communicative with each other. The front-contact is electrically communicative with the upper layer of the p-n junction through the coating. The back-contact is electrically communicative with the lower layer of the p-n junction. The non-limiting embodiment of the solar cell further includes a contact via, which is electrically communicative with the back-contact and with the transparent conductive layer.

Embodiments of the present invention are directed to a solar cell. A non-limiting example of the solar cell includes a first layer with a first dopant type semiconductor. A second layer is over the first layer with the first dopant type semiconductor and a second dopant diffused therein. A coating is over the second semiconductor layer. The coating includes a transparent conductive layer and a gate dielectric layer, which is interposed between the transparent conductive layer and the second layer. The non-limiting example of the solar cell includes circuitry. The circuitry includes a front-contact, a back-contact and a coupling. The front-contact is electrically communicative with the second layer through the coating. The back-contact is electrically communicative with the first layer. The front- and back-contacts are electrically communicative by way of the coupling. In addition, the circuitry includes a contact via, which is electrically communicative with the transparent conductive layer, and an additional coupling by which the contact via and the back-contacts are electrically communicative.

Embodiments of the present invention are directed to a method of increasing an efficiency of a solar cell. A non-limiting example of the method includes inducing majority carrier accumulation at a surface of the solar cell to reduce a surface recombination rate of the solar cell. The inducing of the majority carrier accumulation is accomplished using a self-generated voltage of the solar cell.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

FIG. 1 depicts a side view of a p-n junction for use in a solar cell in accordance with embodiments of the invention;

FIG. 2 depicts a side view of the p-n junction of FIG. 1 with a coating overlying an upper layer thereof in accordance with embodiments of the invention;

FIG. 3 depicts a side view of the p-n junction and the coating of FIG. 2 with a contact trench etched into the upper layer of the p-n junction through the coating in accordance with embodiments of the invention;

FIG. 4 depicts a side view of sidewall spacers formed along the contact trench of FIG. 3 in accordance with embodiments of the invention;

FIG. 8 is a flow diagram illustrating a method of reducing surface recombination of a solar cell in accordance with embodiments of the invention.

Figure 6:
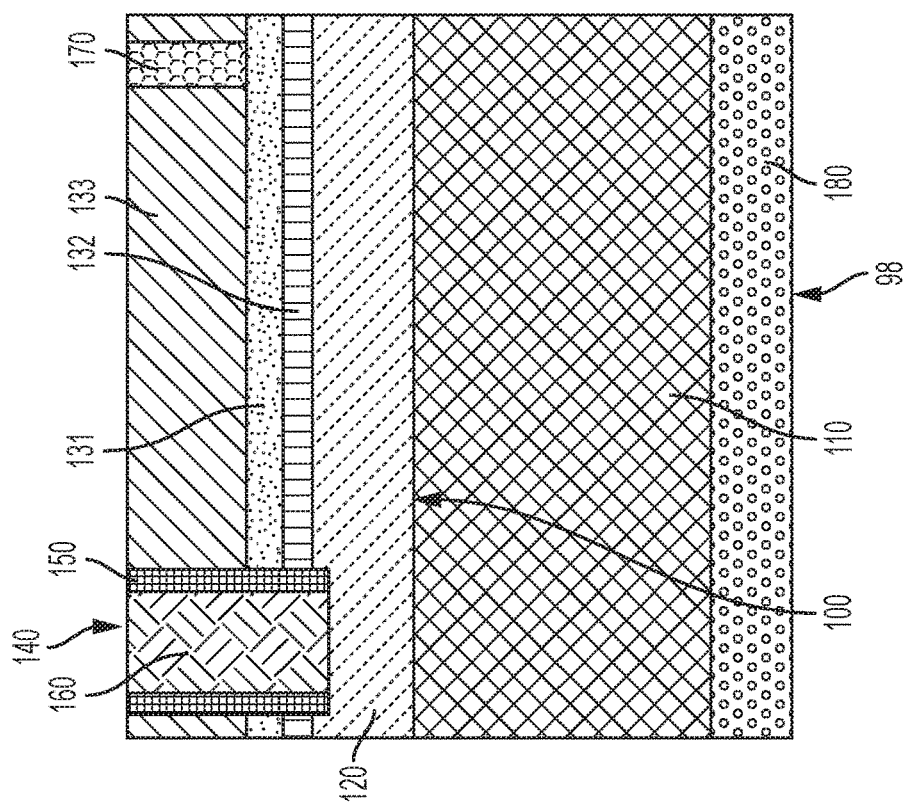
FIG. 6 depicts a side view of a solar cell with a contact via and a back-contact in accordance with embodiments of the invention.

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the described embodiments, the various elements illustrated in the figures are provided with two or three digit reference numbers. With minor exceptions, the leftmost digit(s) of each reference number correspond to the figure in which its element is first illustrated.

DETAILED DESCRIPTION

For the sake of brevity, conventional techniques related to semiconductor device, integrated circuit (IC) and solar cell fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices, semiconductor-based ICs and solar cells are well known and so, in the interest of brevity, many conventional steps will only be mentioned briefly herein or will be omitted entirely without providing the well-known process details.

Turning now to an overview of technologies that are more specifically relevant to aspects of the invention, an operation of a solar cell (of a solar panel, for example) involves several steps. Initially, photons in light hit the solar panel and are absorbed by semiconducting materials, such as silicon. Electrons are then excited from their current molecular/atomic orbital and, once excited, can either recombine or travel through the solar cell to an electrode as captured electricity.

Instances in which electrons are recombined can be grouped together and define a surface recombination characteristic of a solar cell. Because the surface recombination does not involve the generation of electricity, surface recombination is a key issue that limits an efficiency of a solar cell. In addition, because surface recombination velocity is sensitive to surface majority carrier density, increasing a surface majority carrier density in a solar cell can effectively reduce surface recombination velocity and thus reduce the surface recombination characteristic of a solar cell.

Turning now to an overview of the aspects of the invention, one or more embodiments of the invention address the above-described shortcomings of the prior art by providing a method to increase majority carrier density of and an efficiency of a solar cell and by providing a solar cell with an increased efficiency.

The above-described aspects of the invention address the shortcomings of the prior art by making use of a metal-oxide-semiconductor (MOS) field effect of a solar cell. That is, when a cell solar is operating, a p-type side of the solar cell typically has a higher potential. By connecting a back-contact to a front transparent conductive oxide (TCO) layer, a positive bias can be applied to a top MOS structure. Therefore, additional electrons (beyond what would normally be generated in a solar cell of similar capacity) is induced at the top surface so that the surface recombination rate of the solar cell can be reduced. The amount of accumulated electrons available for the additional flows depends on the TCO work function, voltage of solar cell, effective oxide thickness (EOT), characteristics of the gate dielectric, etc.

Turning now to a more detailed description of aspects of the present invention, FIG. 1 depicts a side view of a structure 98 after initial fabrication operations in accordance with aspects of the invention. The structure 98 depicted in FIG. 1 includes a p-n junction 100 for use in a solar cell 101 (see FIG. 7) in accordance with embodiments of the invention. The p-n junction 100 is formed at an interface between a first or lower layer 110 and a second or upper layer 120. The upper layer 120 overlies the lower layer 110. The lower layer 110 can be provided as a first dopant type semiconductor material, such as a p-type silicon (Si). The upper layer 120 is formed by diffusing a second dopant, such as an n-type dopant, into the first dopant type semiconductor material. As such, the lower layer 110 and the upper layer 120 of the p-n junction 100 can be formed to have an opposite polarity once formation and assembly of the solar cell 101 is completed.

It is to be understood that, while the lower layer 110 and the upper layer 120 are described herein as being provided as a p-type silicon (Si) and as an n-type silicon (Si) with n-type dopants, respectively, this is not required and that other doping options are available. For example, the lower layer 110 and the upper layer 120 can be provided as an n-type silicon (Si) and as a p-type silicon (Si), respectively. The following description will, however, focus on the case of the lower layer 110 and the upper layer 120 being provided as a p-type silicon (Si) and as an n-type silicon (Si), respectively, for purposes of clarity and brevity.

FIG. 2 depicts a side view of the structure 98 of FIG. 1 after multiple layers of a coating 130 have been formed over the upper layer 120 in accordance with embodiments of the invention. The multiple layers of the coating 130 can include a gate dielectric layer 132, a transparent conductive layer 131, and an anti-reflective dielectric layer 133, configured and arranged as shown. More specifically, the gate dielectric layer 132 is interposed between the transparent conductive layer 131 and the upper layer 120, and the anti-reflective dielectric layer 133 is over transparent conductive layer 131. The transparent conductive layer 131 can be a transparent conductive oxide (TCO) or a metal layer thin enough to let light pass through.

The multiple layers of the coating 130 can be formed by a known process of deposition in which the gate dielectric layer 132 is deposited over the upper layer 120, the transparent conductive layer 131 is deposited over the gate dielectric layer 132 and the anti-reflective dielectric layer 133 is deposited over the transparent conductive layer 131.

FIG. 3 depicts a side view of the structure 98 after known semiconductor fabrication operations have been used to form a contact trench 140. In embodiments of the invention, the contact trench 140 can be formed using a variety of know semiconductor fabrication operations, including, for example, an etching process executed through the multiple layers (i.e., layers 133, 131, 132) of the coating 130 and into the upper layer 120 in accordance with embodiments of the invention.

As shown in FIG. 3, the contact trench 140 includes an upper portion 141 and a lower portion 142. The upper portion 141 extends through the coating 130 and is delimited by exposed sidewalls 135 of the coating 130. The lower portion 142 extends into the upper layer 120 of the p-n junction 100 and is delimited by exposed sidewalls 121 of the upper layer 120 and by an upward facing surface 122 of the upper layer 120.

FIG. 4 depicts a side view of the structure 98 after known semiconductor fabrication operations have been used to form sidewall spacers 150 along the upper portion 141 and the lower portion 142 of the contact trench 140 in accordance with embodiments of the invention. The sidewall spacers 150 serve to isolate a front-contact 160 (to be described below) from the transparent conductive layer 131. In embodiments of the invention, the sidewall spacers 150 can be formed by a depositional process and can include any suitable dielectric material, including, but not limited to, silicon nitride (SiN) and silicon dioxide ($SiO_2$).

Figure 5:
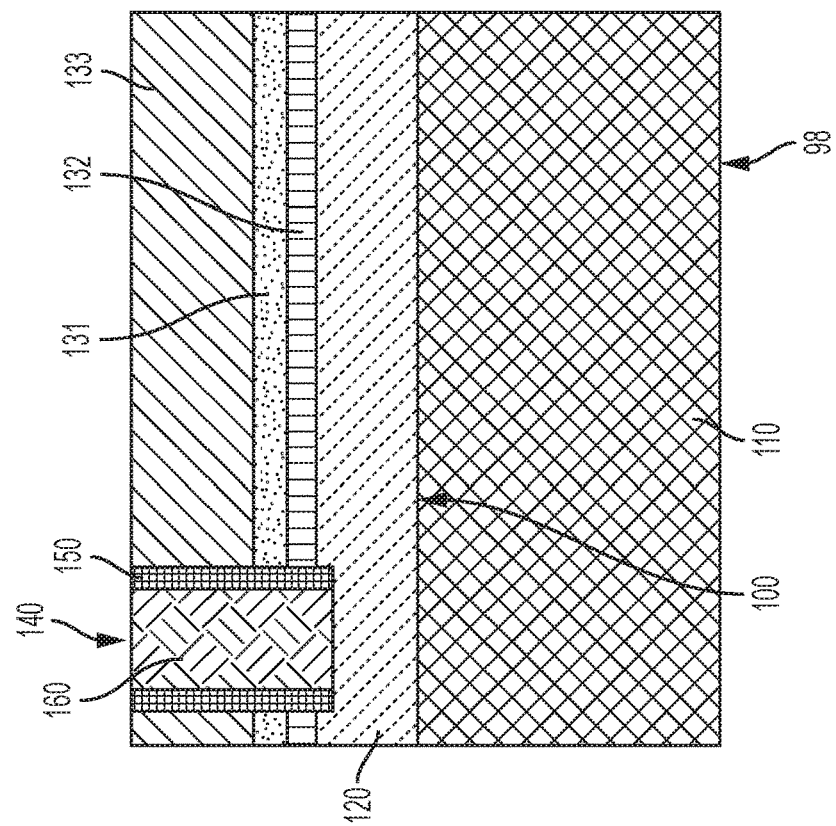
FIG. 5 depicts a side view of front side contact metal forming a front-contact in a region partially bound by the sidewall spacers of FIG. 4 in accordance with embodiments of the invention.

FIG. 5 depicts a side view of the structure 98 after known semiconductor fabrication operations have been used to fill front side contact metal having into remaining space of the contact trench 140 (shown in FIG. 4) between the sidewall spacers 150 to thus form the front-contact 160. The front-contact 160 can include copper (Cu) or another suitable metallic material and occupies the space in the region partially bound by the sidewall spacers 150. A planarization process can be applied to planarize the top surfaces of the anti-reflective dielectric layer 133, the sidewalls 150, and the front-contact 160.

In FIG. 6, known semiconductor fabrication operations have been applied to the structure 98 shown in FIG. 5 to form a solar cell 101 in accordance with embodiments of the invention. More specifically, known semiconductor fabrication operations have been used to form a contact via 170 and a back-contact 180 in accordance with embodiments of the invention. The contact via 170 extends through the anti-reflective dielectric layer 133 to be electrically communicative with the transparent conductive layer 131. The back-contact 180 can be provided as a layer 181 that extends across a downward facing surface 111 of the lower layer 110. In embodiments of the invention, the contact via 170 can be formed as a result of an etching process executed with respect to the anti-reflective layer 133 and a subsequent metallic fill of the trench (not shown) resulting from the etching process. The contact via 170 can include copper (Cu) or another suitable metallic material.

The back-contact 180 can similarly include copper (Cu) or another suitable metallic material.

It is to be understood that, although the respective formations of the front-contact 160, the contact via 170 and the back-contact 180 of FIGS. 3-6 were described in a particular sequence, this sequence is not required and that other optional sequences can be used to achieve the same resulting structure shown in FIG. 6. For example, the front-contact 160, the contact via 170 and the back-contact 180 can all be formed substantially simultaneously with one another.

Figure 7:
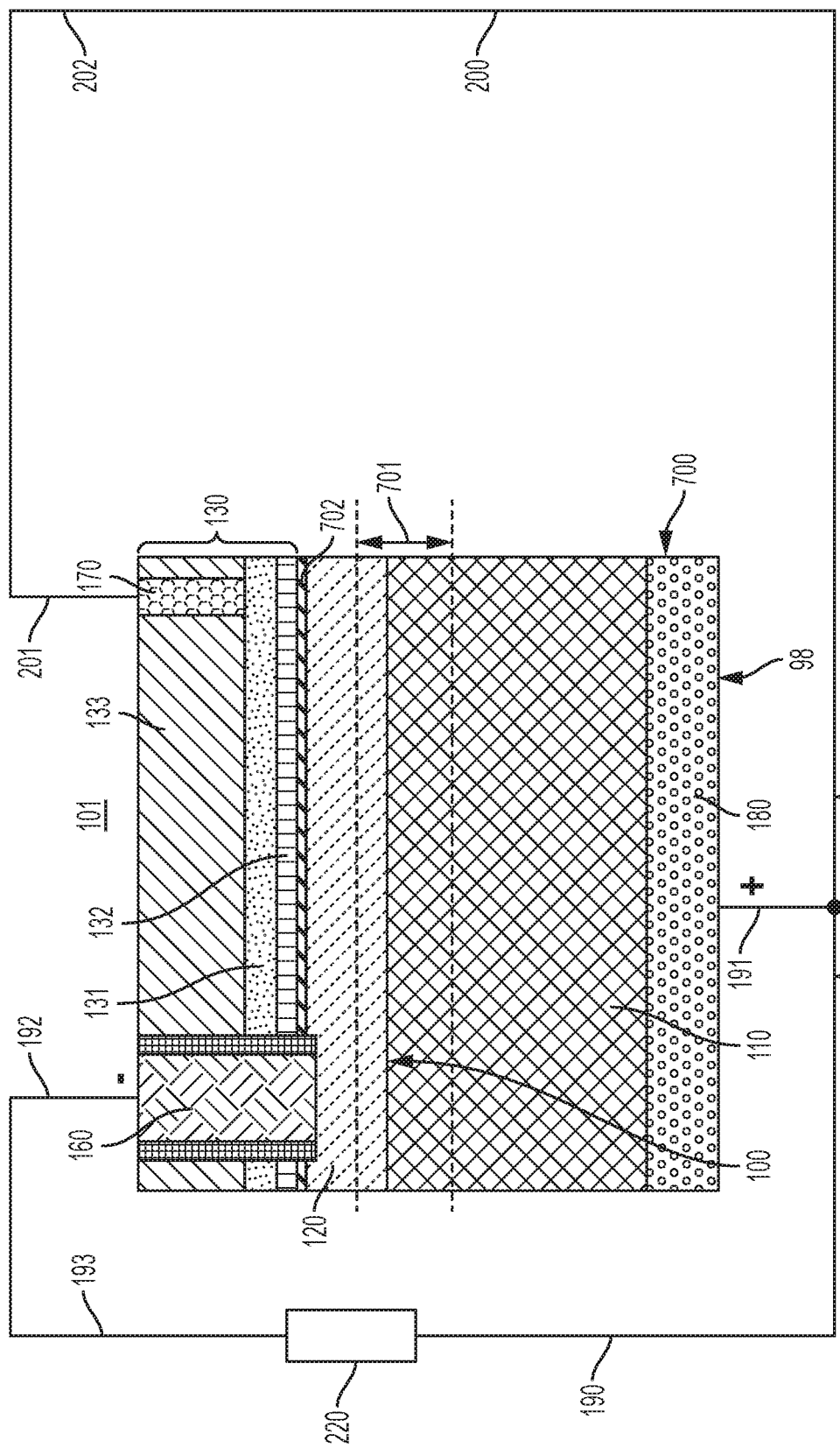
FIG. 7 depicts a side view of the solar cell of FIG. 6 with couplings between the front and back contacts of FIGS. 5 and 6 and between the contact via and the back contact of FIG. 6 in accordance with embodiments of the invention.

In FIG. 7, known fabrication operations have been applied to incorporate the solar cell 101 into a solar-powered device 720, which is configured and arranged to enable the solar cell 101 to convert received light to electricity and provide the electricity to a load 220. The solar-powered device 720 includes the solar cell 101 communicatively coupled through various coupling structures (e.g., 190, 191, 192, 193, 200, 201, 202) to the load 220.

The coupling 190 provides for electrical communication between the front and back contacts 160 and 180 and includes a positive electrode lead 191 electrically connected to the back-contact 180, a negative electrode lead 192 electrically connected to the front-contact 160, and a circuit element 193 electrically connected at opposite ends thereof to the positive and negative electrode leads 191 and 192, respectively. The additional coupling 200 provides for electrical communication between the back-contact 160 and the contact via 170 and includes an additional negative electrode lead 201, which is electrically connected to the contact via 170, and an additional circuit element 202, which is electrically connected at opposite ends thereof to the positive electrode lead 191 and the additional negative electrode lead 201, respectively.

The coupling 190 and the additional coupling 200 and their respective positive and negative electrode leads 191, 192 and 201 and their respective circuit elements 193 and 202 cooperatively form circuitry 210 for the solar-powered device 720. In accordance with some embodiments of the invention, the circuitry 210 can further include the load 220, which is electrically interposed between the back-contact 180 and the front-contact 160.

During operations of the solar cell 101 in the solar-powered device 720 of FIG. 7, the circuitry 210 effectively provides for an operational solar cell and for a biased MOS capacitor structure 700 that increases an efficiency of the operational solar cell. The operational solar cell is provided for by junction region 701 being defined at an interface of the lower and upper layers 110 and 120 and as a result of the electrical communication between the back-contact 180 (i.e., the positive output terminal or the p-type silicon (Si) layer) and the front-contact 160 (i.e., the negative output terminal or the n+ layer) by way of coupling 190. The bias voltage is provided or generated as a result of the electrical communication between the back-contact 180 and the contact via 170 (i.e., transparent conductive layer 131) by way of the additional coupling 200. The biased MOS capacitor structure 700 causes a majority carrier, such as electrons, to accumulate due to field effects in an accumulation layer 702 at the interface of the upper layer 120 and the coating 130. This will lead to a reduced rate of surface recombination and a correspondingly increased solar cell efficiency.

In operation, the solar-powered device 720 converts light to electricity/power in the following manner. Light shines from the top the device and passes through the anti-reflective dielectric layer 133, the transparent conductive layer 131 and the gate dielectric layer 132 to reach the semiconductor region. The light-generated minority carriers (electrons in p-type semiconductor and holes in n-type) diffuse towards the p-n junction 100 and, once there, are collected to become useful current to drive the load 220. Those minority carriers that recombine at the top semiconductor surface cannot be collected and are therefore wasted. With the majority carrier accumulation at the top surface (enabled in this invention), such recombination is reduced, and more useful current can be collected.

With reference to FIG. 8, a method of reducing surface recombination in the solar cell 101 is provided. As shown in FIG. 8, the method includes coating the upper layer 120 of the p-n junction 100 with transparent conductive layer 131 and the gate dielectric layer 132 (block 801). The method further includes forming the front-contact 160 to electrically communicate with the upper layer 120 through transparent conductive layer 131 and the gate dielectric layer 132 (block 802) and forming the back-contact 180 to electrically communicate with the lower layer 110 (block 803). In addition, the method includes coupling the front- and back-contacts 160 and 180 to electrically communicate with each other (block 804). The method also includes forming the contact via 170 to electrically communicate with the transparent conductive layer 131 (block 805) and coupling the back-contact 160 with the contact via 170 to electrically communicate with each other to thus accumulate electrons at the accumulation layer 702 (block 806).

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (rotated 90 degrees or at other orientations) and the spatially relative descriptors used herein interpreted accordingly.

The phrase "selective to," such as, for example, "a first element selective to a second element," means that the first element can be etched and the second element can act as an etch stop.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The term "conformal" (e.g., a conformal layer) means that the thickness of the layer is substantially the same on all surfaces, or that the thickness variation is less than 15% of the nominal thickness of the layer.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases can be controlled and the system parameters can be set so that the depositing atoms arrive at the deposition surface of the semiconductor substrate with sufficient energy to move about on the surface such that the depositing atoms orient themselves to the crystal arrangement of the atoms of the deposition surface. An epitaxially grown semiconductor material can have substantially the same crystalline characteristics as the deposition surface on which the epitaxially grown material is formed. For example, an epitaxially grown semiconductor material deposited on a {100} orientated crystalline surface can take on a {100} orientation. In some embodiments of the invention, epitaxial growth and/or deposition processes can be selective to forming on semiconductor surface, and cannot deposit material on exposed surfaces, such as silicon dioxide or silicon nitride surfaces.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method of increasing an efficiency of a solar cell, the method comprising:
    inducing majority carrier accumulation at a surface of the solar cell to reduce a surface recombination rate of the solar cell,
    the inducing of the majority carrier accumulation being accomplished using a self-generated voltage of the solar cell,
    wherein the solar cell is assembled by a process comprising:
        coating an upper layer of a p-n junction with a transparent conductive layer and a single gate dielectric layer interposed between the transparent conductive layer and the upper layer of the p-n junction;
        forming a front-contact to electrically communicate with the upper layer of the p-n junction through the transparent conductive layer and the gate dielectric layer;
        forming a back-contact to electrically communicate with a lower layer of the p-n junction;
        coupling the front-contact and the back-contact to electrically communicate with each other;
        forming a metallic via to electrically communicate with the transparent conductive layer;
        coupling the metallic via and the back-contact to electrically communicate with each other; and
        accumulating electrons exclusively at an interface between only the upper layer of the p-n junction and only the single gate dielectric layer from electrical communication between the back-contact and the metallic via.

2. The method according to claim 1, wherein the lower layer of the p-n junction comprises a p-type silicon (Si).

3. The method according to claim 2, further comprising doping the upper layer of the p-n junction with an n-type dopant.

4. The method according to claim 1, further comprising electrically interposing a load between the front-contact and the back-contact.

5. A method of forming a solar cell, the method comprising:
    assembling a p-n junction comprising upper and lower layers;
    overlaying a coating over the upper layer of the p-n junction, the coating comprising a transparent conductive layer and a single gate dielectric layer, the single gate dielectric layer being interposed between the transparent conductive layer and the upper layer of the p-n junction such that the single gate dielectric layer separates an entirety of the transparent conductive layer from an entirety of the upper layer of the p-n junction;
    disposing a front-contact and a back-contact in electrical communication with each other and with the upper layer of the p-n junction through the coating and with the lower layer of the p-n junction, respectively;
    extending spacers along an entirety of the front-contact through the coating and into the upper layer of the p-n junction;
    disposing a contact via in electrical communication with the back-contact and with the transparent conductive layer; and
    forming an electron accumulation layer from electrical communication between the back-contact and the contact via at an interface which is exclusively defined between only the upper layer of the p-n junction and only the single gate dielectric layer.

6. The method according to claim 5, wherein:
    the lower layer of the p-n junction comprises a first dopant type semiconductor; and
    the upper layer of the p-n junction comprises the first dopant type semiconductor with a second dopant diffused therein.

7. The method according to claim 6, wherein the first dopant type semiconductor material comprises a p-type silicon (Si).

8. The method according to claim 6, wherein the second dopant comprises an n-type dopant.

9. The method according to claim 5, wherein the transparent conductive layer comprises transparent conductive oxide (TCO).

10. The method according to claim 5, further comprising overlaying an anti-reflective layer over the transparent conductive layer.

11. The method according to claim 5, further comprising electrically interposing a load between the front-contact and the back-contact.

12. A method of forming a solar cell, the method comprising:
- overlaying a second layer over a first layer with a first dopant, the second layer having the first dopant and a second dopant;
- overlaying a coating over the second layer, the coating comprising a transparent conductive layer and a single gate dielectric layer, the single gate dielectric layer being interposed between the transparent conductive layer and the second layer such that the single gate dielectric layer separates an entirety of the transparent conductive layer from an entirety of the second layer;
- disposing a front-contact in electrical communication with the second layer through the coating;
- insulating the front-contact from the coating by spacers extending along an entirety of the front-contact through the coating and into the second layer;
- disposing a back-contact in electrical communication with the first layer;
- providing a coupling by which the front- and back-contacts are electrically communicative;
- disposing a contact via in electrical communication with the transparent conductive layer;
- providing an additional coupling by which the contact via and the back-contacts are electrically communicative; and
- forming an electron accumulation layer from electrical communication between the back-contact and the contact via at an interface which is exclusively defined between only the second layer and only the single gate dielectric layer.

13. The method according to claim 12, wherein the first dopant comprises a p-type silicon (Si) and the second dopant comprises an n-type dopant.

14. The method according to claim 12, wherein the transparent conductive layer comprises transparent conductive oxide (TCO).

15. The method according to claim 12, further comprising overlaying an anti-reflective layer over the transparent conductive layer.

16. The method according to claim 12, further comprising electrically interposing a load between the front-contact and the back-contact.

* * * * *